(12) United States Patent
Chen

(10) Patent No.: US 11,259,435 B2
(45) Date of Patent: Feb. 22, 2022

(54) SINGLE-ENCLOSURE MULTI-DRIVE DATA STORAGE SYSTEM

(71) Applicant: Super Micro Computer, Inc., San Jose, CA (US)

(72) Inventor: Hsiao-Chung Chen, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 15/808,831

(22) Filed: Nov. 9, 2017

(65) Prior Publication Data
US 2019/0141851 A1 May 9, 2019

(51) Int. Cl.
| | |
|---|---|
| *H05K 7/14* | (2006.01) |
| *H05K 7/18* | (2006.01) |
| *G11B 33/12* | (2006.01) |
| *H01R 12/79* | (2011.01) |

(52) U.S. Cl.
CPC ......... *H05K 7/1487* (2013.01); *G11B 33/126* (2013.01); *G11B 33/128* (2013.01); *H01R 12/79* (2013.01); *H05K 7/1439* (2013.01); *H05K 7/1452* (2013.01); *H05K 7/18* (2013.01)

(58) Field of Classification Search
CPC ....... H05K 7/1487; H01R 12/79; H01R 12/77
See application file for complete search history.

(56) References Cited

U.S. PATENT DOCUMENTS

| | | | | |
|---|---|---|---|---|
| 5,018,836 A * | 5/1991 | Noda | ..................... | G11B 7/093 |
| | | | | 359/814 |
| 6,247,944 B1 * | 6/2001 | Bolognia | ................ | G06F 1/184 |
| | | | | 439/157 |
| 6,270,174 B1 * | 8/2001 | Nishi | ..................... | G06F 1/181 |
| | | | | 312/223.1 |
| 7,502,224 B2 * | 3/2009 | Motoe | ..................... | G06F 1/187 |
| | | | | 361/679.33 |
| 7,808,777 B2 * | 10/2010 | Luo | ...................... | G11B 33/127 |
| | | | | 361/679.37 |
| 8,054,620 B2 * | 11/2011 | Roesner | .............. | G11B 33/128 |
| | | | | 361/679.33 |
| 9,468,127 B2 * | 10/2016 | Chen | ..................... | H05K 7/1492 |
| 9,629,275 B1 * | 4/2017 | Beall | .................... | H05K 7/1401 |
| 10,595,443 B2 * | 3/2020 | Chang | .................. | G11B 33/124 |
| 2003/0022533 A1 * | 1/2003 | Joo | ........................ | H01R 12/79 |
| | | | | 439/67 |

(Continued)

*Primary Examiner* — Rockshana D Chowdhury
*Assistant Examiner* — Douglas R Burtner
(74) *Attorney, Agent, or Firm* — Artegis Law Group, LLP

(57) ABSTRACT

A system includes a support frame residing within a region conforming to a 3.5-inch form-factor disk drive specification, and a plurality of data storage drives, wherein each data storage drive resides entirely within the region. Each data storage drive conforms to a 2.5-inch form-factor disk drive specification, is mounted on the support frame via at least one external mounting hole that is positioned on a surface of the data storage drive in conformance with the 2.5-inch form-factor disk drive specification, is communicatively coupled to a backplane via an electrical connection device, and the electrical connection device includes a flexible electrical connector that, when coupled to a first end of the data storage drive, does not extend beyond the region, and has a removal tab through which a removal force is exerted to urge the data storage drive away from the support frame.

16 Claims, 7 Drawing Sheets

(56) References Cited

U.S. PATENT DOCUMENTS

| | | | | |
|---|---|---|---|---|
| 2003/0142243 A1* | 7/2003 | Lee | G11B 33/122 | 349/1 |
| 2005/0133327 A1* | 6/2005 | Kao | H02G 11/00 | 191/12 R |
| 2006/0028804 A1* | 2/2006 | Hidaka | G11B 33/126 | 361/754 |
| 2006/0028805 A1* | 2/2006 | Hidaka | G11B 33/126 | 361/754 |
| 2006/0039106 A1* | 2/2006 | Hidaka | G11B 33/126 | 361/679.38 |
| 2006/0221501 A1* | 10/2006 | Sato | H05K 3/363 | 360/234.5 |
| 2007/0012749 A1* | 1/2007 | Yamaguchi | B23K 3/0623 | 228/179.1 |
| 2009/0168243 A1* | 7/2009 | Luo | G11B 33/127 | 360/133 |
| 2009/0273896 A1* | 11/2009 | Walker | G06F 1/187 | 361/679.33 |
| 2011/0069441 A1* | 3/2011 | Killen | G11B 33/128 | 361/679.33 |
| 2011/0149501 A1* | 6/2011 | Hughes | G11B 33/128 | 361/679.33 |
| 2011/0286691 A1* | 11/2011 | Hopkins | G02B 6/43 | 385/14 |
| 2013/0180935 A1* | 7/2013 | Lee | G06F 1/187 | 211/41.12 |
| 2015/0342080 A1* | 11/2015 | Chen | G11B 33/128 | 361/679.31 |
| 2016/0234962 A1* | 8/2016 | Shinsato | G11B 33/128 | |
| 2017/0042056 A1* | 2/2017 | Horii | G06F 1/16 | |
| 2017/0118838 A1* | 4/2017 | Williams | H05K 3/32 | |
| 2017/0322604 A1* | 11/2017 | Chen | G06F 1/181 | |
| 2018/0197579 A1* | 7/2018 | Chen | H05K 7/14 | |
| 2018/0343741 A1* | 11/2018 | Williams | H05K 3/027 | |
| 2019/0069446 A1* | 2/2019 | Chang | H05K 7/20736 | |

* cited by examiner

SINGLE-ENCLOSURE MULTI-DRIVE DATA STORAGE SYSTEM

BACKGROUND OF THE INVENTION

Field of the Invention

The present invention relates generally to storage devices and, more specifically, to a single-enclosure multi-drive data storage system.

Description of the Related Art

The use of distributed computing systems, e.g., "cloud computing," is becoming increasingly common for consumer and enterprise data storage. This so-called "cloud data storage" employs large numbers of networked storage servers that are organized as a unified repository for data and are configured as banks or arrays of hard disk drives, central processing units, and solid-state drives. Typically, these servers are arranged in configurations to facilitate large-scale operations. For example, a single cloud data storage system may include thousands or tens of thousands of storage servers installed in stacked or rack-mounted arrays. Consequently, any reduction in the space required for any one server can significantly reduce the overall size and operating cost of a cloud data storage system.

3.5-inch form-factor drive bays are often employed for mounting magnetic disks and solid-state drives in a standardized rack frame in cloud data storage systems, distributed computing systems, and other rack-mounted computing systems. The 3.5-inch form-factor specification, also referred to as the SFF-8301 specification, is a commonly-used standard defining the dimensions and external mounting holes of a compliant device. Notably, devices that are designed according to the 3.5-inch form-factor specification are compatible with the drive bays originally used for 3.5-inch floppy disk drives. With respect to dimensions, 3.5-inch form-factor devices have one of two profiles, the larger being the so-called "half-height drive," which has a height of 1.63".

The standardized rack frames most commonly employed in cloud data storage systems are typically configured for mounting 3.5-inch form-factor half-height drives. Thus, any magnetic hard drive or solid-state drive that conforms to the 3.5-inch form-factor specification for half-height drives can be mounted in any 3.5-inch drive slot. Because the 3.5-inch form-factor specification is so widely recognized, and so many different devices are designed to conform to that specification, a wide variety of drives and devices can be mounted on a standardized rack frame without customized mechanical interfaces, brackets, adapters, and the like. Thus, the wide-spread adoption of the 3.5-inch form-factor specification enables significant flexibility with respect to the types of drives and other devices that can be mounted on the standardized rack frames employed in large-scale distributed computing systems.

One drawback of using 3.5-inch form-factor devices in distributed computing systems is that disk drives and solid-state drives that are 3.5-inch form-factor compliant do not benefit from many of the advances in device miniaturization that have enabled the development of high-capacity drives that are 2.5-inch form-factor compliant. Instead, a 3.5-inch form-factor slot is limited to accommodating a single hard disk drive or solid state drive, even though 2.5-inch form-factor drives are much smaller and therefore do not require the space of a 3.5-inch form-factor device. Consequently, for a rack frame of a given size, fewer 3.5-inch devices can be included in that rack frame, resulting in the data storage capacity of the rack frame not being maximized.

As the foregoing illustrates, what is needed in the art are higher density data storage solutions that are compatible with the 3.5-inch form-factor specification.

SUMMARY OF THE INVENTION

One embodiment of the present invention sets forth a system that includes a support frame that resides within a region conforming to a 3.5-inch form-factor disk drive specification; and a plurality of data storage drives, wherein each data storage drive resides entirely within the region. In addition, each data storage drive conforms to a 2.5-inch form-factor disk drive specification, is mounted on the support frame via at least one external mounting hole that is positioned on a surface of the data storage drive in conformance with the 2.5-inch form-factor disk drive specification, is communicatively coupled to a backplane via an electrical connection device, and the electrical connection device includes a flexible electrical connector that, when coupled to a first end of the data storage drive, does not extend beyond the region, and has a removal tab through which a removal force is exerted to urge the data storage drive away from the support frame.

At least one advantage of the disclosed design is that the storage capacity of multiple data storage drives is realized in the volume and form-factor occupied by a single data storage drive in conventional systems. An additional advantage is that individual data storage drives can be easily removed and replaced without time-consuming power-downs and/or mechanical disassembly of the data storage device. Consequently, the increased number of data storage drives does not complicate the process by which drives are replaced in the data storage device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the embodiments of the present invention. However, it will be apparent to one of skill in the art that the embodiments of the present invention may be practiced without one or more of these specific details.

According to various embodiments of the present invention, a data storage device that conforms to the 3.5-inch form-factor disk drive specification (also referred to as the SFF-8301 specification) includes multiple easily removable and hot-pluggable 2.5-inch form-factor data storage drives. Thus, in such embodiments, the storage capacity of multiple data storage drives is realized in the volume and form-factor occupied by a single data storage drive in conventional systems. Furthermore, because the 2.5-inch form-factor drives are easily removable and hot-pluggable, the increased number of data storage drives associated with a single 3.5-inch form-factor slot does not complicate the process by which drives are replaced in the data storage system. Instead, any of the multiple 2.5-inch form-factor data storage drives can be removed from the data storage system without powering down the data storage system and/or the other 2.5-inch form-factor drives included therein. One such embodiment is illustrated in FIG. 1.

Figure 1:
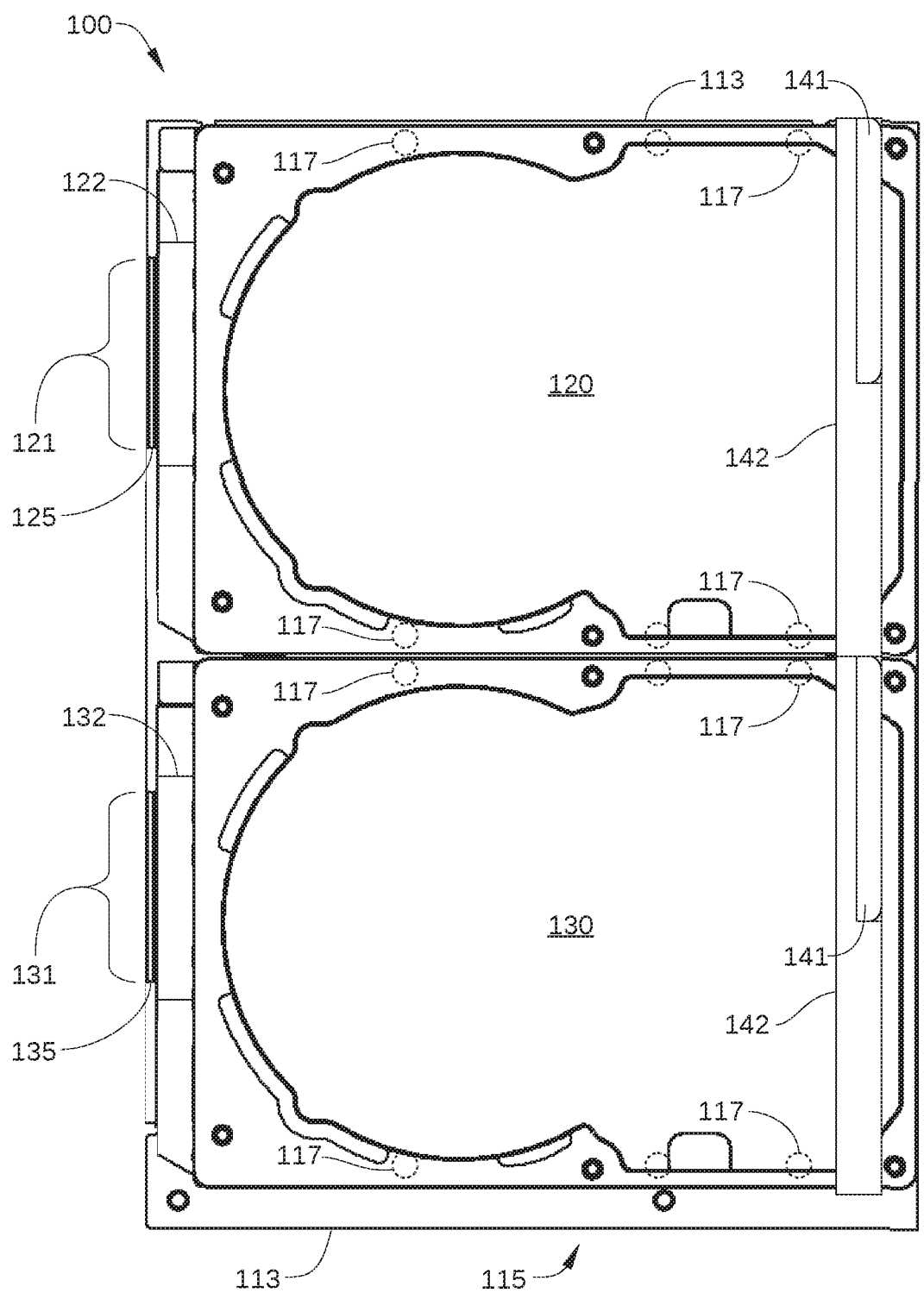
FIG. 1 is a top view of a data storage device that includes a first data storage drive and a second data storage drive, according various embodiments of the present invention.

FIG. 1 is a top view of a data storage device 100 that includes a first data storage drive 120 and a second data storage drive 130, configured according various embodiments of the present invention. In some embodiments, data storage device 100 includes a top cover, and in other embodiments, data storage device 100 does not include a top cover. For clarity, the embodiment illustrated in FIG. 1 is an embodiment of data storage device 100 that does not include a top cover.

Data storage device 100 is a multiple-drive mass storage device that can be configured for use in a distributed computing system (not shown). As such, data storage device 100 has a form factor that conforms to the 3.5-inch form-factor disk drive specification. That is, the outside dimensions of data storage device 100 fall within or otherwise conform to the 3.5-inch form-factor specification for data storage drives. In some embodiments, the location of one or more mounting holes 117 disposed on an outer surface of data storage device 100, such as a support plate 115, also conform to the 3.5-inch form-factor specification. From the top view of FIG. 1, mounting holes 117 are disposed under first data storage drive 120 and second data storage drive 130, and therefore are shown as hidden lines in FIG. 1.

In the embodiment illustrated in FIG. 1, data storage device 100 includes multiple data storage devices that conform to the 2.5-inch disk drive specification (first data storage drive 120 and second data storage drive 130), which are mounted on a support frame 113. It is noted that in some embodiments, data storage drives that conform to the 2.5-inch disk drive specification includes any disk drives that are smaller than the region defined by the 2.5-inch disk drive specification. Support frame 113 is contained within a region that conforms to the 3.5-inch form-factor specification. That is, support frame 113 does not extend outside the footprint of the outer dimensions set forth in the 3.5-inch form-factor storage drive specification. As shown, first data storage drive 120 and second data storage drive 130 are mounted adjacent to each other on support frame 113. Support frame 113 may be formed from a metallic or polymeric plate, a printed circuit board (PCB), and/or a fully or partially enclosed housing, such as a disk drive enclosure. In the embodiment illustrated in FIG. 1, support frame 113 includes a support plate 115 and one or more housing walls 114.

First data storage drive 120 and second data storage drive 130 can each be any technically feasible nonvolatile mass storage device, including a magnetic hard drive or solid-state drive. As such, in some embodiments, first data storage drive 120 includes an electrical connector 121 that is configured to mate with a serial ATA (SATA) receptacle 122 disposed on an end of first data storage drive 120. Alternatively, SATA receptacle 122 may be any other suitable serializer/deserializer (SerDes) connector, which includes NVM Express (NVMe), Serial Attached SCSI (SAS), connectors, and Ethernet connectors, among others. Similarly, second data storage drive 130 includes an electrical connector 131 that is configured to mate with a SATA receptacle 132 disposed on an end of second data storage drive 130. Alternatively, SATA receptacle 132 may be any other suitable SerDes connector. In FIG. 1, electrical connectors 121 and 131 are shown coupled to SATA receptacle 122 and SATA receptacle 132, respectively. Therefore, only an external portion 125 of electrical connector 121 extends out of SATA receptacle 122 and is visible in FIG. 1, and only an external portion 135 of electrical connector 131 extends out of SATA receptacle 132 and is visible in FIG. 1. Electrical connector 121 and electrical connector 131 are described in greater detail in conjunction with FIGS. 3-5.

First data storage drive 120 and second data storage drive 130 each include a removal tab 141 that enables a removal force to be exerted on the end of the associated data storage drive that urges that end away from the support frame. Thus, in the embodiment illustrated in FIG. 1, the removal tab 141 of first data storage drive 120 is disposed proximate an end of first data storage drive 120 that is opposite the end of first data storage drive 120 that includes SATA receptacle 122. Similarly, the removal tab 141 of second data storage drive 130 is disposed proximate an end of second data storage drive 130 that is opposite the end of second data storage drive 130 that includes SATA receptacle 132.

In some embodiments, removal tab 141 is formed from a metallic strap 142 or band coupled to a surface of first data storage drive 120 or second data storage drive 130. For example, in some embodiments, removal tab 141 is a fixed member coupled to and extending from a top surface of first data storage drive 120 or second data storage drive 130, where the top surface of first data storage drive 120 or second data storage drive 130 is the surface that is exposed when first data storage drive 120 or second data storage drive 130 is coupled to support frame 113. In such embodiments, removal tab 141 may be a stamped tab that is bent away from such a metallic strap 142. It is noted that such an embodiment of removal tab 141 is more clearly illustrated in FIG. 4. In other embodiments, removal tab 141 includes a hinged member coupled to and extendable from the top surface of first data storage drive 120 or second data storage drive 130. In either case, removal of first data storage drive 120 or second data storage drive 130 is facilitated with removal tab 141, since one end of first data storage drive 120 or second data storage drive 130 can be rotated upward away from support frame 103.

First data storage drive 120 and second data storage drive 130 are each 2.5-inch form-factor data storage drives. By contrast, support frame 113 has a footprint that conforms to the form factor of a 3.5-inch form-factor data storage drive. In this context, the "footprint" of support frame 113 refers to the total area of support frame 113 visible in plan view and bounded by the outer dimensions of support frame 113, i.e., the area contained within the extents of the outer dimensions of support frame 113. It is noted that, due to the constraints of the 3.5-inch form-factor storage drive specification, support frame 113 provides very little clearance around first data storage drive 120 and second data storage drive 130 when disposed on support frame 113. Thus, external portion 125 of electrical connector 121 is configured to extend beyond the footprint of first data storage drive 120 by a very small distance, for example no greater than that sufficient to enable first data storage drive 120 to be rotated upward and away from support plate 115 for removal from data storage device 100. Similarly, external portion 135 of electrical connector 131 is configured to extend beyond the footprint of second data storage drive 130 by a very small distance, for example no greater than that sufficient to enable second data storage drive 130 to be rotated upward and away from support plate 115 for removal from data storage device 100.

Figure 2:
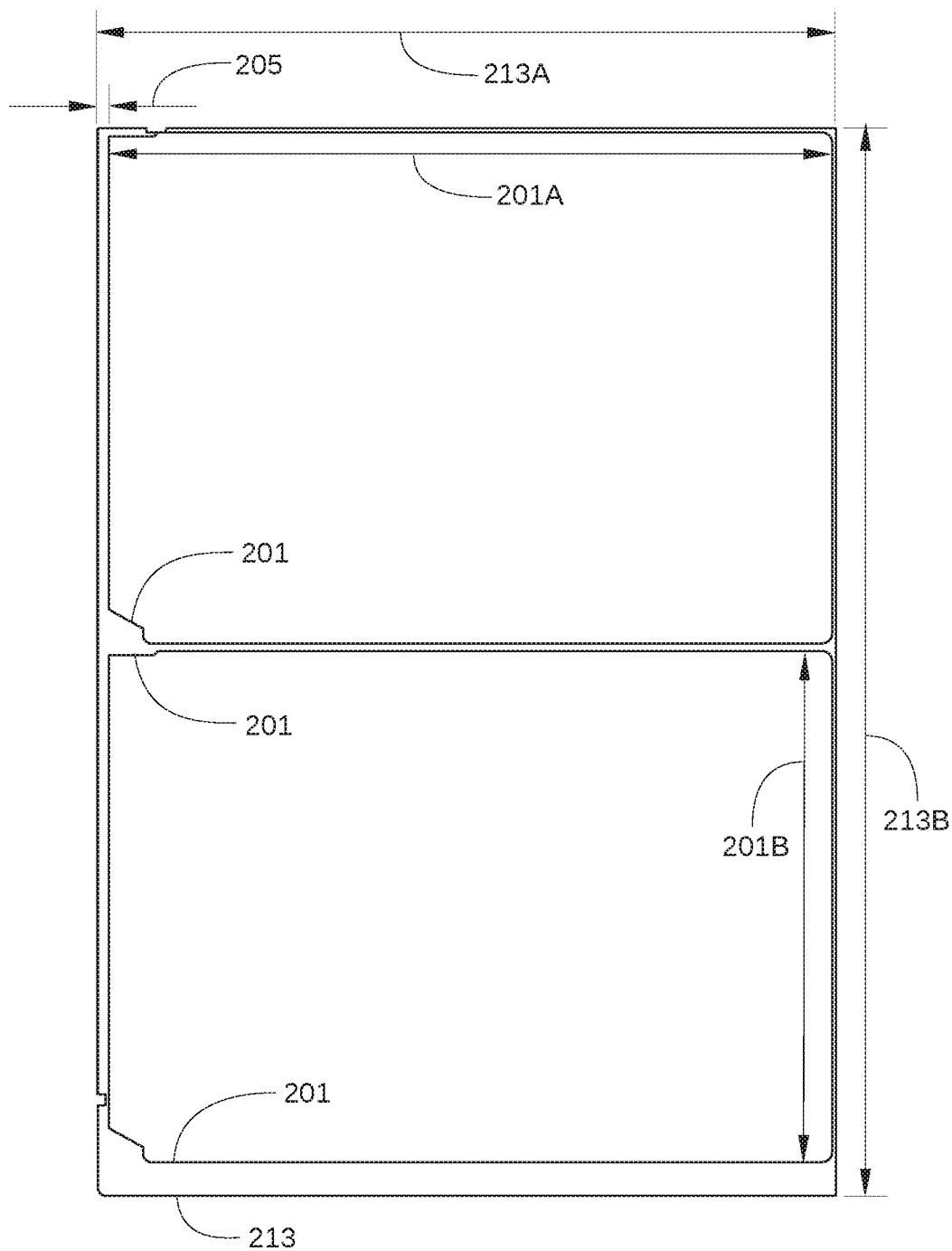
FIG. 2 is a plan view of a footprint of two 2.5-inch form-factor data storage drives superimposed onto a footprint of the support frame of the data storage device of FIG. 1, according to various embodiments of the present invention.

The relationship between the footprint of support frame 113, the footprints of first data storage drive 120 and second data storage drive 130, and the available space for external portion 125 of electrical connectors 121 and 131 is shown more clearly in FIG. 2.

FIG. 2 is a plan view of a footprint 201 of two 2.5-inch form-factor data storage drives superimposed onto a footprint 213 of, for example, support frame 113 of FIG. 1, according to various embodiments of the present invention. Footprint 201 conforms to the 2.5-inch form-factor specification for data storage drives (the so-called SFF-8201), and therefore has a length 201A up to about 100.45 mm and a width 201B of up to about 70.1 mm. Footprint 213 conforms to the 3.5-inch form-factor specification for data storage devices (SFF-8301), and therefore has a width 213A no greater than about 101.35 mm and a length 213B no greater than about 147.0 mm. Thus, width 213A of support frame 113 can accommodate length 201A of a 2.5-inch form-factor data storage device. Further, length 213B of support frame 113 can accommodate the width 201B of two 2.5-inch form-factor data storage devices, as shown in FIG. 1, albeit with very little clearance 205. Clearance 205 indicates the available space for a SATA connector, such as electrical connectors 121 and 131 of FIG. 1, to extend outside of SATA receptacle 122 or SATA receptacle 132 when coupled thereto. In the embodiment illustrated in FIGS. 1 and 2, based on the 2.5-inch form-factor specification for data storage devices and the 3.5-inch form-factor specification for data storage devices, clearance 205 on one end of footprints 201 is generally between about 0.9 mm and about 1.4 mm (with substantially negligible clearance on an opposite end of footprints 201). A conventional SATA connector extends significantly more than 1.4 mm outside of a SATA receptacle when coupled thereto, as shown in FIG. 3.

Figure 3:
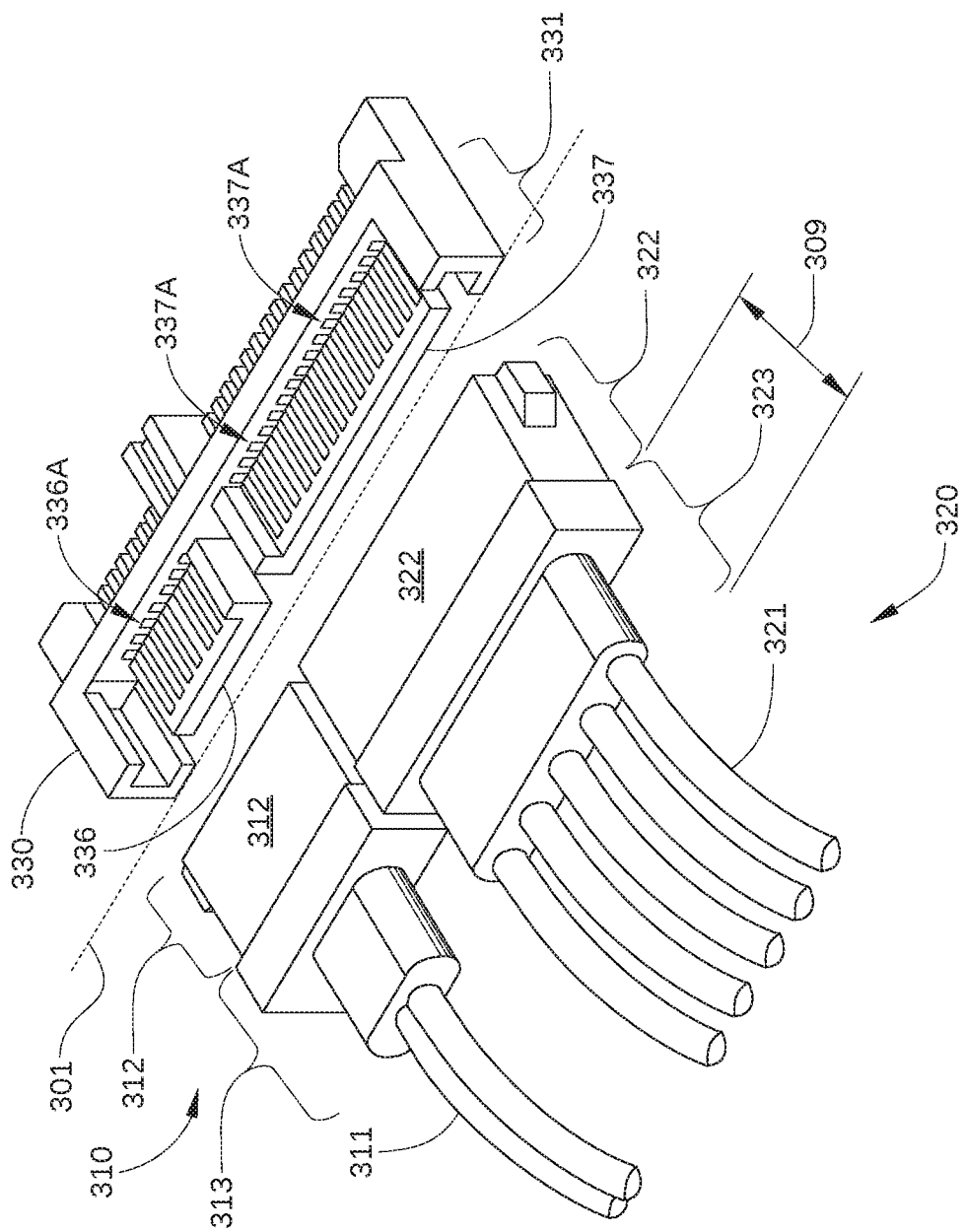
FIG. 3 is an isometric view of a conventional cable-end signal connector and a conventional cable-end power connector.

FIG. 3 is an isometric view of a conventional cable-end signal connector 310 (sometimes referred to as a female SATA signal connector) and a conventional cable-end power connector 320 (sometimes referred to as a female SATA power connector). Cable-end signal connector 310 and cable-end power connector 320 are both shown positioned proximate a device-mounted SATA connector 330 (sometimes referred to as a male SATA connector). Cable-end signal connector 310 is disposed on an end of a SATA signal cable 311, cable-end power connector 320 is disposed on and end of one or more power cables 321, and device-mounted SATA connector 330 may be mounted on a surface of a mass storage device, such as first data storage drive 120 or second data storage drive 130 of FIG. 1. Device-mounted SATA connector 330 includes an L-shaped insertion tab 336 with signal contacts 336A formed thereon and an L-shaped insertion tab 337 with power contacts 337A formed thereon. For clarity, the mass storage device associated with device-mounted SATA connector 330 is omitted from FIG. 3, but for reference a footprint 301 of such a device is indicated in FIG. 3. Footprint 301 may correspond to a portion of either of footprints 201 in FIG. 2.

When cable-end signal connector 310 is coupled to device-mounted SATA connector 330, an inserted portion 312 of cable-end signal connector 310 overlaps with a receptacle portion 331 of device-mounted SATA connector 330. Similarly, when cable-end power connector 320 is coupled to device-mounted SATA connector 330, an inserted portion 322 of cable-end power connector 320 overlaps with receptacle portion 331 of device-mounted SATA connector 330. It is noted that inserted portion 312 and inserted portion 322 do not extend beyond device-mounted SATA connector 330 or footprint 301 when coupled to device-mounted SATA connector 330. However, remaining portion 313 of cable-end signal connector 310 and remaining portion 323 of cable-end power connector 320 do extend a significant distance 309 beyond footprint 301, for example on the order of five to ten millimeters or more. Because distance 309 is much larger than clearance 205 (shown in FIG. 2), there is insufficient space in data storage device 100 for cable-end signal connector 310 and cable-end power connector 320. Consequently, cable-end signal connector 310 and cable-end power connector 320 cannot be used to couple signal or power cables to, for example, first data storage drive 120 or second data storage drive 130 of FIG. 1 without increasing the size of data storage device 100 beyond the footprint of support frame 113.

According to one or more embodiments, electrical connectors 121 and 131 of FIG. 1 may be configured as a low-profile connector. More specifically, when electrical connector 121 or 131 is coupled to device-mounted SATA connector 330 of FIG. 3, electrical connector 121 and electrical connector 131 do not extend significantly beyond footprint 301 of the electronic device associated with device-mounted SATA connector 330. Therefore, when electrical connector 121 or electrical connector 131 is connected to an electronic device with device-mounted SATA connector 330, the footprint of the electronic device is not extended by more than the thickness of external portion 125 or 135, as shown in FIG. 1.

In such embodiments, electrical connector 121 includes conductive pins or wires that extend from a surface of electrical connector 121 that faces support plate 115 when electrical connector 121 is coupled to SATA receptacle 122 and first data storage drive 120 is coupled to support frame 113. Similarly, electrical connector 131 includes conductive pins or wires that extend from a surface of electrical connector 131 that faces support plate 115 when electrical connector 131 is coupled to SATA receptacle 132 and second data storage drive 130 is coupled to support frame 113. These features allow power and/or signal conductors exiting electrical connector 121 and 131 to be routed in a direction that does not increase the effective size of the electronic device to which electrical connector 121 or 131 is coupled. Thus, electrical connector 121, when coupled to SATA receptacle 122, only extends beyond the footprint of first data storage drive 120 by the thickness of external portion 125, and electrical connector 131, when coupled to SATA receptacle 132, only extends beyond the footprint of second data storage drive 130 by the thickness of external portion 125.

In some embodiments, first data storage drive 120 and second data storage drive 130 are each communicatively coupled to a backplane or other printed circuit board included in data storage device 100 via a respective electrical connection device that includes a flexible electrical connector. One such embodiment is illustrated in FIG. 4.

Figure 4:
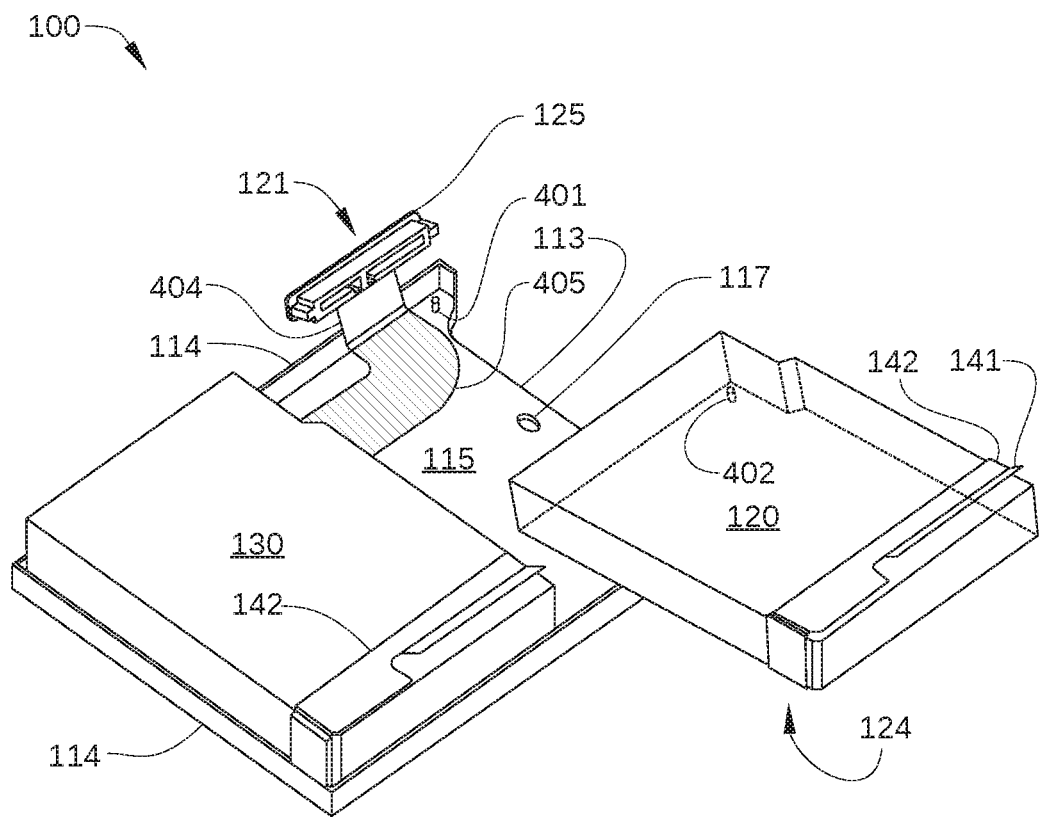
FIG. 4 is an isometric view of the data storage device of FIG. 1, according to various embodiments of the present invention.

FIG. 4 is an isometric view of data storage device 100, according to various embodiments of the present invention. Data storage device 100 is illustrated with first data storage drive 120 removed therefrom. That is, the end of first data storage drive 120 that is proximate removal tab 141 has been rotated upward and away from support plate 115 of support frame 113, and then separated and pulled away from electrical connector 121. When the end of first data storage drive 120 is rotated upward from support plate 115 via removal tab 141, one or more mounting protrusions 401 formed on support frame 113 are separated from corresponding mounting holes 402 on a bottom surface 124 of first data storage drive 120. In the embodiment illustrated in FIG. 4, only a single mounting protrusion 401 and mounting hole 402 (hidden lines) are shown for clarity. In other embodiments, up to all four of the mounting holes 402 specified by SFF-8201 to be present on bottom surface 124 of first data storage drive 120 are coupled to a corresponding mounting protrusion on support frame 113. Mounting protrusions 401 can be any technically feasible mechanical fastener compatible with mounting holes 402, such as snaps, posts, or other protrusions.

In some embodiments, first data storage drive 120 is communicatively coupled to a backplane or other printed circuit board (PCB) that is included in data storage device 100 via an electrical connection device. In such embodiments, the electrical connection device includes a flexible electrical connector 404, electrical connector 121, and a planar electrical connector 405 (cross-hatched in FIG. 4). Flexible electrical connector 404 is a non-rigid electrical connector that includes a plurality of power and signal conductors for connecting to first data storage drive 120. Flexible connector 404 is configured to elastically deform when first data storage drive 120 is rotated upward with removal tab 141, and thereby allow electrical connector 121 to rotate or swivel relative to support frame 113 and planar electrical conductor 405. Consequently, flexible connector 404 is not damaged when first data storage drive 120 is removed from data storage device 100 in this way. In an alternative embodiment, the backplane or other PCB communicatively coupled to first data storage drive 120 and second data storage drive 130 is disposed outside the footprint of support frame 113 and adjacent to external portions 125 and 135.

In some embodiments, flexible connector 404 includes a flexible PCB. In such embodiments, flexible connector 404 may further include a flat spring coupled to the flexible PCB to further reduce the potential for conductors within the flexible PCB being damaged when flexible connector 404 bends during removal and/or installation of first data storage drive 120. In such embodiments, the flat spring can be a metallic or plastic plate. In other embodiments, flexible connector 404 includes a multiple-conductor cable, such as a ribbon cable, that is coupled to a hinged device. The hinged device enables rotation of electrical connector 121 as first data storage drive 120 is rotated upward via removal tab 141.

Planar electrical connector 405 is typically disposed between support plate 115 and first data storage drive 120. In addition, planar electrical connector 405 includes a plurality of conductors for communicatively coupling electrical connector 121 and flexible connector 404 with a backplane or PCB (not shown) included in or adjacent to data storage device 100. In some embodiments, planar electrical connector 405 includes a PCB, is formed from a PCB, or includes at least some PCB material or layers. In some embodiments, planar electrical connector 405 also couples second data storage drive 130 to the backplane or PCB included in or adjacent to data storage device 100. Thus, in such embodiments, planar electrical connector 405 is a single common connector assembly that couples first data storage drive 120 and second data storage drive 130 to the backplane of data storage device 100. One such embodiment is illustrated in FIG. 5.

Figure 5:
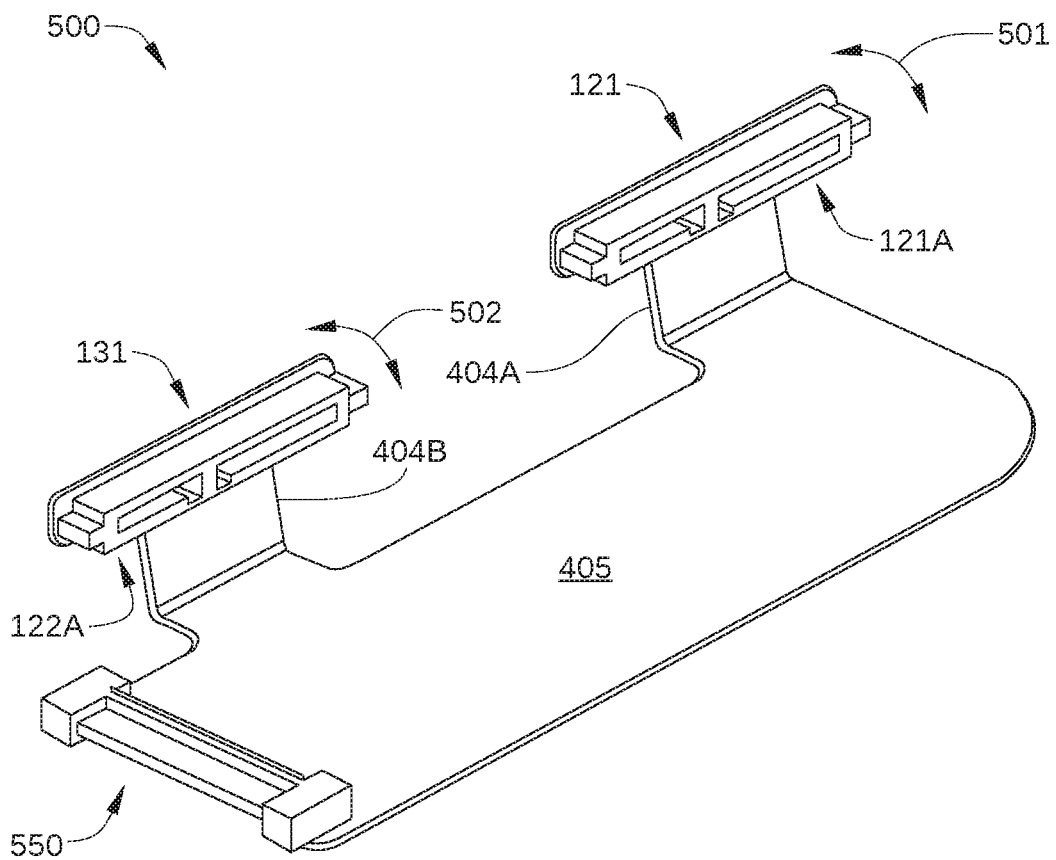
FIG. 5 is an isometric view of an electrical connection device, according to various embodiments of the present invention.

FIG. 5 is an isometric view of an electrical connection device 500, according to various embodiments of the present invention. In the embodiment illustrated in FIG. 5, electrical connection device 500 includes planar electrical connector 405, a first flexible electrical connector 404A that couples electrical connector 121 to planar electrical connector 405, and a second flexible connector 404B that couples electrical connector 131 to planar electrical connector 405. As described above in conjunction with FIG. 4, first flexible connector 404A enables rotational movement of electrical connector 121 (indicated by arrow 501) with respect to planar electrical connector 405 and second flexible connector 404B enables rotational movement of electrical connector 131 (indicated by arrow 502) with respect to planar electrical connector 405. Electrical connection device 500 further includes a connector 550 that electrically couples the conductors of flexible connectors 404A and 404B with a backplane or PCB (not shown) included in data storage device 100. For example, electrical connector 550 may include a plurality of solder joints that are aligned with corresponding conductors included in the backplane or PCB included in data storage device 100.

It is noted that SATA-compatible data storage drives are typically configured with male SATA connectors. Thus, in the embodiment illustrated in FIG. 5, electrical connectors 121 and 131 are configured as female SATA connectors, and therefore can each be coupled to a respective mating male SATA connector disposed on an end of a data storage drive. In alternative embodiments, electrical connectors 121 and 131 are configured as male SATA connectors.

The conductors of electrical connector 121 extend from a surface 121A of electrical connector 121 that faces downward when first data storage drive 120 is coupled to support frame 133 and electrical connector 121 is coupled to the mating connector of first data storage drive 120 (SATA receptacle 122 in FIG. 1). That is, the conductors of electrical connector 121 extend toward support plate 115, planar electrical connector 405, and the backplane of data storage device 100. Similarly, the conductors of electrical connector 131 extend from a surface 131A of electrical connector 131 that faces downward when second data storage drive 130 is coupled to support frame 133 and electrical connector 131 is coupled to the mating connector of second data storage drive 130 (SATA receptacle 132 in FIG. 1).

Figure 6:
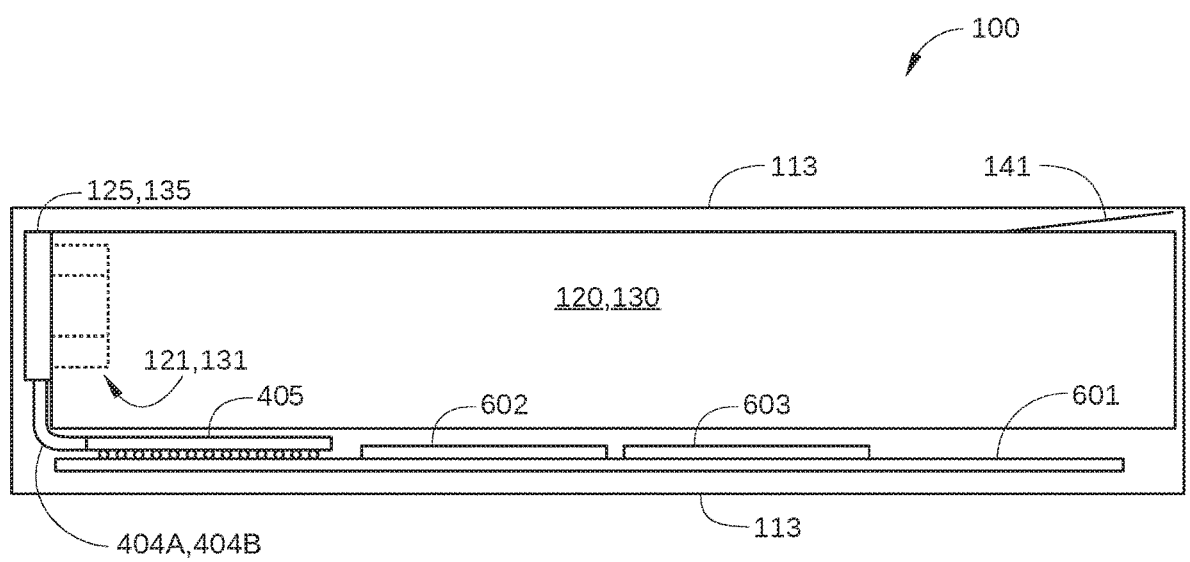
FIG. 6 is a cross-sectional side view of the data storage device of FIG. 1, according to various embodiments of the present invention.

FIG. 6 is a cross-sectional side view of data storage device 100, according to various embodiments of the present invention. As shown, first data storage drive 120 and second data storage drive 130 are disposed within support frame 113, and electrical connections 121 and 131 respectively couple first data storage drive 120 and second data storage drive 130 to a backplane 601 disposed within support frame 113. External portions 125 and 135 of electrical connectors 121 and 131 are visible outside of first data storage drive 120 and second data storage drive 130, while the remainder portions of electrical connectors 121 and 131 are shown as hidden lines. For clarity, support plate 115 and mounting protrusions 401 formed on support frame 113 are omitted in FIG. 6. In some embodiments, additional devices 603 are formed or mounted on backplane 601, such as one or more processors or volatile memory devices. In such embodiments, data storage device 100 may be configured as a server node rather than as a mass storage device, and the processor is configured to perform storage operations in conjunction with at least one of data storage drive 130 and data storage drive 130.

In some embodiments, hot-plugging circuitry 602 is formed on or included in backplane 601. Hot-plugging circuitry 602 is configured to conform to hot-plugging standards known in the art. Thus, in such embodiments, either first data storage drive 120 or second data storage drive 130 can be removed while data storage device 100 is fully powered and operational. Further, a new data storage drive can then be installed in data storage device 100 by attaching the new data storage drive via electrical connector 121 or 131.

In the embodiment illustrated in FIG. 6, backplane 601 is disposed within the region associated with support frame 113 that conforms to a 3.5-inch form-factor disk drive specification. Alternatively, backplane 601 can be disposed outside of such a region and adjacent to support frame 113.

Figure 7:
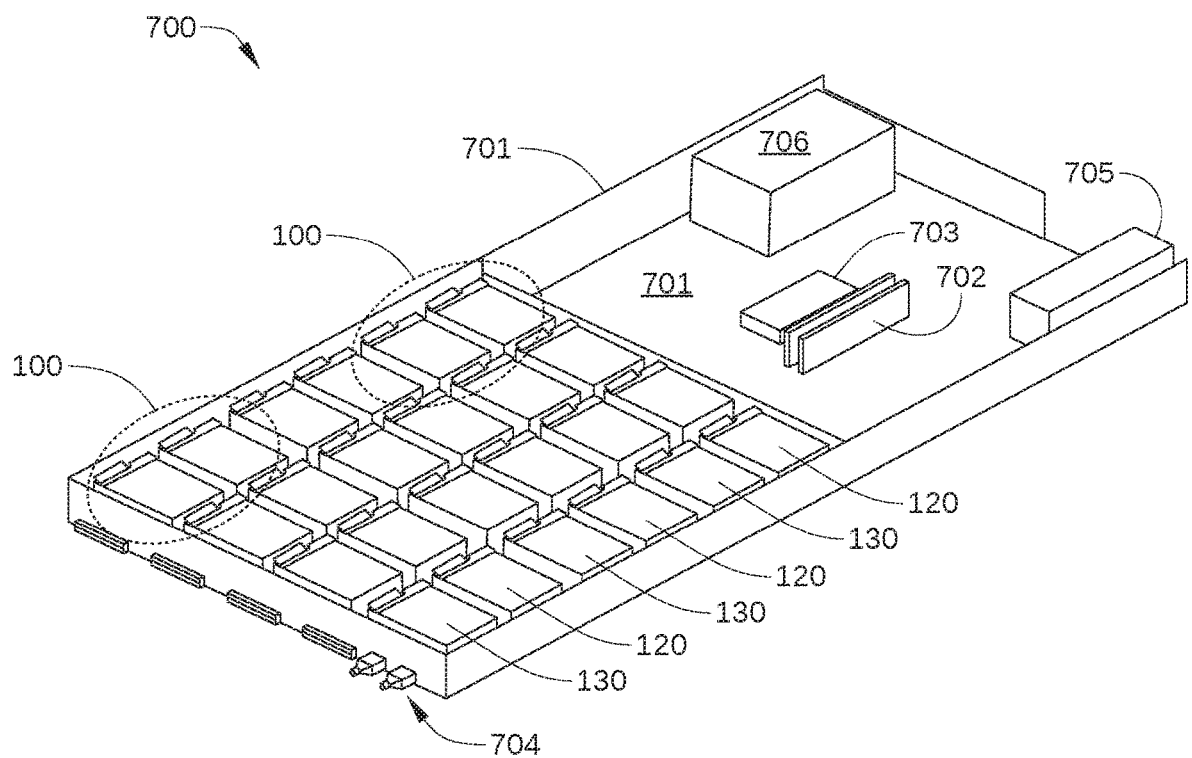
FIG. 7 is an isometric of a data storage system, configured according to various embodiments of the present invention.

FIG. 7 is an isometric of a data storage system 700, configured according to various embodiments of the present invention. Data storage system 700 includes a plurality of data storage devices 100 mounted on a 1U (one rack unit in height) chassis 701. Data storage system 700 may also include one or more volatile memory cards 702, processors 703, power connections 704, a networking interface 705, a power supply 706, and the like. Thus, data storage system 700 can be a high-capacity data storage system in a distributed computing system.

As shown, the plurality of data storage devices 100 can be mounted in chassis 701 in a high-density configuration. In addition, each of the first data storage drive 120 and second data storage drive 130 included in data storage devices 100 can be readily removed and replaced. When data storage devices 100 include suitable hot-plugging circuitry, first data storage drives 120 and second data storage drives 130 can be removed while data storage system 700 is powered and operating.

In sum, embodiments of the present invention provide a data storage device that conforms to the 3.5-inch form-factor disk drive specification and includes multiple easily removable and hot-pluggable 2.5-inch form-factor data storage drives. Because each 2.5-inch form-factor data storage drive includes a removal tab and is communicatively coupled to the data storage device via a flexible electrical connection, removal of each drive is greatly facilitated. Further, in embodiments in which the 2.5-inch form-factor data storage drives are hot-pluggable, drives within the data storage device can be replaced without powering down the entire data storage device or system in which the data storage device is incorporated.

At least one advantage of the disclosed design is that the storage capacity of multiple data storage drives is realized in the volume and form-factor occupied by a single data storage drive in conventional systems. An additional advantage is that individual data storage drives can be easily removed and replaced without time-consuming power-downs and/or mechanical disassembly of the data storage device. Consequently, the increased number of data storage drives does not complicate the process by which drives are replaced in the data storage device.

1. In some embodiments, a system comprises a support frame that resides within a region conforming to a 3.5-inch form-factor disk drive specification; and a plurality of data storage drives, wherein each data storage drive resides entirely within the region and: conforms to a 2.5-inch form-factor disk drive specification, is mounted on the support frame via at least one external mounting hole that is positioned on a surface of the data storage drive in conformance with the 2.5-inch form-factor disk drive specification, is communicatively coupled to a backplane via an electrical connection device, and the electrical connection device includes a flexible electrical connector that, when coupled to a first end of the data storage drive, does not extend beyond the region, and has a removal tab through which a removal force is exerted to urge the data storage drive away from the support frame.

2. The system of clause 1, wherein at least one data storage drive comprises a solid-state drive or a magnetic disk drive.

3. The system of clauses 1 or 2, wherein the flexible electrical connector comprises either a flexible printed circuit board (PCB) or a multiple-conductor cable coupled to a hinge device.

4. The system of any of clauses 1-3, wherein the flexible electrical connector comprises the flexible PCB and further includes a flat spring coupled to the flexible PCB.

5. The system of any of clauses 1-4, wherein the electrical connection device further includes a first female Serializer/Deserializer (SerDes) connector that mates with a first male SerDes connector that is mounted on a first data storage drive included in the plurality of data storage drives.

6. The system of any of clauses 1-5, wherein the electrical connection device further includes a second female SerDes connector that mates with a second male SerDes connector that is mounted on a second of the multiple data storage drives.

7. The system of any of clauses 1-6, wherein the first female SerDes connector is coupled to a first flexible electrical connector included in the electrical connection device and the second SerDes connector is coupled to a second flexible electrical connector included in the electrical connection device.

8. The system of any of clauses 1-7, wherein the first flexible electrical connector and the second flexible electrical connector are coupled to the backplane via a single common connector assembly.

9. The system of any of clauses 1-9, wherein the support frame includes at least one external mounting hole that is positioned in conformance with the 3.5-inch form-factor disk-drive specification.

10. The system of any of clauses 1-9, wherein the support frame includes at least one mounting protrusion that aligns with the at least one external mounting hole.

11. The system of any of clauses 1-10, wherein electrical connection device further includes an electrical connector that is configured as a low-profile connector that, when coupled to the first end of the data storage drive, does not extend beyond the region.

12. The system of any of clauses 1-11, wherein one or more conductors included in the electrical connector extend from a surface of the electrical connector that faces the backplane when the electrical connector is coupled to the first end of the data storage drive, and the data storage drive is coupled to the support frame.

13. The system of any of clauses 1-12, wherein the removal tab comprises a fixed member coupled to and extending from a top surface of the data storage drive, the top surface being exposed when the data storage drive is coupled to the support frame.

14. The system of any of clauses 1-13, wherein the removal tab comprises a hinged member coupled to and extendable from a top surface of the data storage drive, the top surface being exposed when the data storage drive is coupled to the support frame.

15. The system of any of clauses 1-14, further comprising a processor that is resides entirely within the region, is mounted to the backplane, and is communicatively coupled to each data storage drive included in the plurality of data storage drives.

16. The system of any of clauses 1-15, wherein the processor performs data storage operations in conjunction with each data storage drive included in the plurality of data storage drives.

17. In some embodiments, a system comprises a chassis, and a plurality of data storage subsystems coupled to the chassis, each data storage subsystem including: a support frame that resides within a region conforming to a 3.5-inch form-factor disk drive specification; and a plurality of data storage drives, wherein each data storage drive resides entirely within the region and conforms to a 2.5-inch form-factor disk drive specification, is mounted on the support frame via at least one external mounting hole that is positioned on a surface of the data storage drive in conformance with 2.5-inch form-factor disk drive specification, is communicatively coupled to a backplane via an electrical connection device, wherein the backplane resides entirely within the region, and the electrical connection device includes a flexible electrical connector that, when coupled to a first end of the data storage drive, does not extend beyond the region, and, has a removal tab through which a removal force is to be exerted to urge the second end away from the support frame.

18. The system of clause 17, wherein, for each data storage subsystem, the support frame includes at least one external mounting hole that is positioned in accordance with the 3.5-inch form-factor disk-drive specification.

19. The system of clauses 17 or 18, wherein each data storage subsystem included in the plurality of data storage subsystems is coupled to the chassis via the at least one external mounting hole that is positioned in accordance with the 3.5-inch form-factor disk-drive specification.

20. In some embodiments, a system comprises a support frame that resides within a region conforming to a first storage device specification with a first form-factor; and a plurality of data storage devices, wherein each data storage device resides entirely within the region and: conforms to a second storage device specification with a second form-factor that is smaller than first form-factor, and is communicatively coupled to a backplane via an electrical connection device, wherein the electrical connection device includes a flexible electrical connector that, when coupled to a first end of the data storage device, does not extend beyond the region.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to devices, persons skilled in the art will appreciate that the systems and techniques described herein are applicable to other types of devices. The foregoing description and drawings are, accordingly, to be regarded in an illustrative rather than a restrictive sense.

What is claimed is:

1. A system, comprising:
a support frame that resides within a region conforming to a 3.5-inch form-factor disk drive specification; and
a plurality of data storage drives, wherein each data storage drive resides entirely within the region and:
conforms to a 2.5-inch form-factor disk drive specification,
is mounted on the support frame via at least one external mounting hole that is positioned on a surface of the data storage drive in conformance with the 2.5-inch form-factor disk drive specification,
is communicatively coupled to a backplane via an electrical connection device, and the electrical connection device includes a flexible electrical connector that, when coupled to a first end of the data storage drive, does not extend beyond the region, and
has a removal tab through which a removal force is exerted on the data storage drive to urge the data storage drive away from the support frame by rotating the data storage drive away from the support frame independently of the other data storage drives included in the plurality of data storage drives and about an axis proximate to the first end of the data storage drive, wherein the removal tab is disposed proximate to a second end of the data storage drive opposite of the first end of the data storage drive.

2. The system of claim 1, wherein at least one data storage drive comprises a solid-state drive or a magnetic disk drive.

3. The system of claim 1, wherein the flexible electrical connector comprises either a flexible printed circuit board (PCB) or a multiple-conductor cable.

4. The system of claim 3, wherein the flexible electrical connector comprises the flexible PCB.

5. The system of claim 1, wherein the electrical connection device further includes a first female Serializer/Deserializer (SerDes) connector that mates with a first male SerDes connector that is mounted on a first data storage drive included in the plurality of data storage drives.

6. The system of claim 5, wherein the electrical connection device further includes a second female SerDes connector that mates with a second male SerDes connector that is mounted on a second of the multiple data storage drives.

7. The system of claim 6, wherein the first female SerDes connector is coupled to a first flexible electrical connector included in the electrical connection device and the second SerDes connector is coupled to a second flexible electrical connector included in the electrical connection device.

8. The system of claim 7, wherein the first flexible electrical connector and the second flexible electrical connector are coupled to the backplane via a single common connector assembly.

9. The system of claim 1, wherein the support frame includes at least one external mounting hole that is positioned in conformance with the 3.5-inch form-factor disk-drive specification.

10. The system of claim 1, wherein the support frame includes at least one mounting protrusion that aligns with the at least one external mounting hole.

11. The system of claim 1, wherein electrical connection device further includes an electrical connector that is configured as a low-profile connector that, when coupled to the first end of the data storage drive, does not extend beyond the region.

12. The system of claim 11, wherein one or more conductors included in the electrical connector extend from a surface of the electrical connector that faces the backplane when the electrical connector is coupled to the first end of the data storage drive, and the data storage drive is coupled to the support frame.

13. The system of claim 1, wherein the removal tab comprises a fixed member coupled to and extending from a top surface of the data storage drive, the top surface being exposed when the data storage drive is coupled to the support frame.

14. The system of claim 1, wherein the removal tab comprises a hinged member coupled to and extendable from a top surface of the data storage drive, the top surface being exposed when the data storage drive is coupled to the support frame.

15. The system of claim 1, further comprising a processor that is resides entirely within the region, is mounted to the backplane, and is communicatively coupled to each data storage drive included in the plurality of data storage drives.

16. The system of claim 15, wherein the processor performs data storage operations in conjunction with each data storage drive included in the plurality of data storage drives.

* * * * *